(12) United States Patent
McGarvey

(10) Patent No.: US 12,402,429 B2
(45) Date of Patent: Aug. 26, 2025

(54) SEMICONDUCTOR PACKAGES WITH AN ARRAY OF SINGLE-PHOTON AVALANCHE DIODES SPLIT BETWEEN MULTIPLE SEMICONDUCTOR DICE

(71) Applicant: SEMICONDUCTOR COMPONENTS INDUSTRIES, LLC, Scottsdale, AZ (US)

(72) Inventor: Brian Patrick McGarvey, Templemartin (IE)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 0 days.

(21) Appl. No.: 18/525,991

(22) Filed: Dec. 1, 2023

(65) Prior Publication Data
US 2024/0105748 A1 Mar. 28, 2024

Related U.S. Application Data

(62) Division of application No. 16/949,837, filed on Nov. 17, 2020, now Pat. No. 11,876,108.

(51) Int. Cl.
*H10F 39/00* (2025.01)
*H10F 30/225* (2025.01)
*H10F 77/00* (2025.01)

(52) U.S. Cl.
CPC ....... *H10F 39/8063* (2025.01); *H10F 30/225* (2025.01); *H10F 39/804* (2025.01); *H10F 77/959* (2025.01)

(58) Field of Classification Search
CPC .. H10F 39/8063; H10F 30/225; H10F 39/804; H10F 77/959; H10F 19/75; H10F 39/806; H01L 2924/00; G02B 3/0006
See application file for complete search history.

(56) References Cited

U.S. PATENT DOCUMENTS

| 5,079,189 | A | 1/1992 | Drake et al. | |
|---|---|---|---|---|
| 7,612,425 | B2* | 11/2009 | Endo | H10F 39/024 257/431 |
| 10,015,416 | B2* | 7/2018 | Borthakur | H04N 25/585 |
| 10,396,117 | B2* | 8/2019 | Onal | H10F 39/813 |
| 10,593,712 | B2* | 3/2020 | Borthakur | H04N 25/702 |

(Continued)

OTHER PUBLICATIONS

R. H. Rasshofer et al. "Automotive Radar and Lidar Systems for Next Generation Driver"; Assistance Functions Advances in Radio Science, 3, 205-209, 2005.

*Primary Examiner* — Jennifer D Bennett
*Assistant Examiner* — Erin R Garber
(74) *Attorney, Agent, or Firm* — Treyz Law Group, P.C.; Joseph F. Guihan

(57) ABSTRACT

A semiconductor package may include a line array of single-photon avalanche diodes (SPADs). The line array of single-photon avalanche diodes may be split between multiple silicon dice. Each silicon die may be overlapped by at least one lens to focus light away from gaps between the dice and towards the single-photon avalanche diodes. There may be one single-photon avalanche diode for each silicon die or multiple single-photon avalanche diodes for each silicon die. When there are multiple single-photon avalanche diodes for each silicon die, lenses may be formed over only the edge single-photon avalanche diodes.

18 Claims, 8 Drawing Sheets

(56) References Cited

U.S. PATENT DOCUMENTS

| | | | |
|---|---|---|---|
| 11,791,368 B2* | 10/2023 | Yanagita | H10F 39/024 |
| | | | 438/75 |
| 2008/0165257 A1 | 7/2008 | Boettiger | |
| 2011/0090485 A1 | 4/2011 | Cronin et al. | |
| 2011/0198503 A1 | 8/2011 | Koren et al. | |
| 2011/0240865 A1 | 10/2011 | Frach et al. | |
| 2013/0153975 A1 | 6/2013 | Henseler et al. | |
| 2013/0313414 A1 | 11/2013 | Pavlov et al. | |
| 2014/0217476 A1 | 8/2014 | Onakado et al. | |
| 2016/0181459 A1 | 6/2016 | Birk et al. | |
| 2016/0238836 A1* | 8/2016 | Oganesian | G02B 3/0043 |
| 2019/0189694 A1 | 6/2019 | Mu et al. | |
| 2019/0259796 A1* | 8/2019 | Cho | H10F 39/024 |
| 2020/0273892 A1* | 8/2020 | Perkins | H10F 39/18 |
| 2020/0295069 A1* | 9/2020 | Sulfridge | H10F 39/8063 |
| 2021/0120199 A1* | 4/2021 | Kim | H04N 25/766 |
| 2021/0185266 A1 | 6/2021 | Chan et al. | |
| 2021/0325576 A1 | 10/2021 | Schwartz et al. | |

* cited by examiner

SEMICONDUCTOR PACKAGES WITH AN ARRAY OF SINGLE-PHOTON AVALANCHE DIODES SPLIT BETWEEN MULTIPLE SEMICONDUCTOR DICE

This application is a division of non-provisional patent application Ser. No. 16/949,837, filed Nov. 17, 2020, which is incorporated by reference herein in its entirety.

BACKGROUND

This relates generally to imaging systems and, more particularly, to imaging systems that include single-photon avalanche diodes (SPADs) for single photon detection.

Modern electronic devices such as cellular telephones, cameras, and computers often use digital image sensors. Image sensors (sometimes referred to as imagers) may be formed from a two-dimensional array of image sensing pixels. Each pixel typically includes a photosensitive element (such as a photodiode) that receives incident photons (light) and converts the photons into electrical signals.

Conventional image sensors may suffer from limited functionality in a variety of ways. For example, some conventional image sensors may not be able to determine the distance from the image sensor to the objects that are being imaged. Conventional image sensors may also have lower than desired image quality and resolution.

To improve sensitivity to incident light, single-photon avalanche diodes (SPADs) may sometimes be used in imaging systems. Single-photon avalanche diodes may be capable of single-photon detection.

It is within this context that the embodiments described herein arise.

DETAILED DESCRIPTION

Embodiments of the present invention relate to imaging systems that include single-photon avalanche diodes (SPADs).

Some imaging systems include image sensors that sense light by converting impinging photons into electrons or holes that are integrated (collected) in pixel photodiodes within the sensor array. After completion of an integration cycle, collected charge is converted into a voltage, which is supplied to the output terminals of the sensor. In complementary metal-oxide semiconductor (CMOS) image sensors, the charge to voltage conversion is accomplished directly in the pixels themselves, and the analog pixel voltage is transferred to the output terminals through various pixel addressing and scanning schemes. The analog pixel voltage can also be later converted on-chip to a digital equivalent and processed in various ways in the digital domain.

In single-photon avalanche diode (SPAD) devices, on the other hand, the photon detection principle is different. The light sensing diode is biased above its breakdown point, and when an incident photon generates an electron or hole, this carrier initiates an avalanche breakdown with additional carriers being generated. The avalanche multiplication may produce a current signal that can be easily detected by readout circuitry associated with the SPAD. The avalanche process can be stopped (or quenched) by lowering the diode bias below its breakdown point. Each SPAD may therefore include a passive and/or active quenching circuit for halting the avalanche.

This concept can be used in two ways. First, the arriving photons may simply be counted (e.g., in low light level applications). Second, the SPAD pixels may be used to measure photon time-of-flight (ToF) from a synchronized light source to a scene object point and back to the sensor, which can be used to obtain a 3-dimensional image of the scene.

Figure 1:
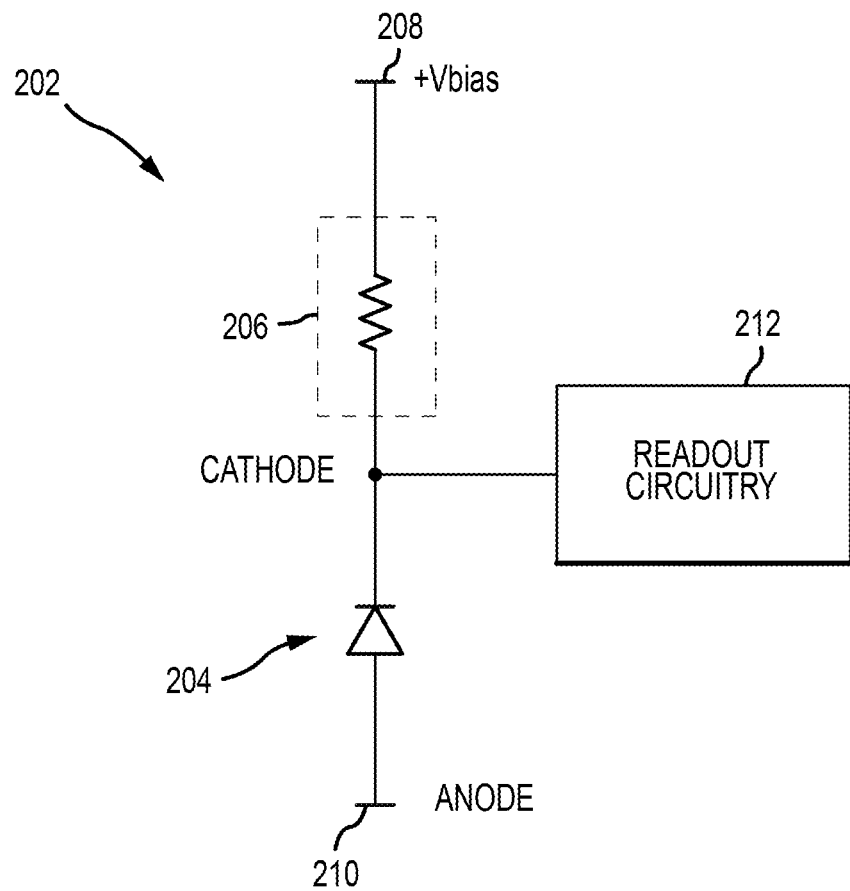
FIG. 1 is a circuit diagram showing an illustrative single-photon avalanche diode pixel in accordance with an embodiment.

FIG. 1 is a circuit diagram of an illustrative SPAD device 202. As shown in FIG. 1, SPAD device 202 includes a SPAD 204 that is coupled in series with quenching circuitry 206 between a first supply voltage terminal 210 (e.g., a ground power supply voltage terminal) and a second supply voltage terminal 208 (e.g., a positive power supply voltage terminal). In particular, SPAD device 202 includes a SPAD 204 having an anode terminal connected to power supply voltage terminal 210 and a cathode terminal connected directly to quenching circuitry 206. SPAD device 202 that includes SPAD 204 connected in series with a quenching resistor 206 is sometimes referred to collectively as a photo-triggered unit or "microcell." During operation of SPAD device 202, supply voltage terminals 208 and 210 may be used to bias SPAD 204 to a voltage that is higher than the breakdown voltage (e.g., bias voltage Vbias is applied to terminal 208). Breakdown voltage is the largest reverse voltage that can be applied to SPAD 204 without causing an exponential increase in the leakage current in the diode. When SPAD 204 is reverse biased above the breakdown voltage in this manner, absorption of a single-photon can trigger a short-duration but relatively large avalanche current through impact ionization.

Quenching circuitry 206 (sometimes referred to as quenching element 206) may be used to lower the bias voltage of SPAD 204 below the level of the breakdown voltage. Lowering the bias voltage of SPAD 204 below the breakdown voltage stops the avalanche process and corresponding avalanche current. There are numerous ways to form quenching circuitry 206. Quenching circuitry 206 may be passive quenching circuitry or active quenching circuitry. Passive quenching circuitry may, without external control or monitoring, automatically quench the avalanche current once initiated. For example, FIG. 1 shows an example where a resistor component is used to form quenching circuitry 206. This is an example of passive quenching circuitry.

This example of passive quenching circuitry is merely illustrative. Active quenching circuitry may also be used in SPAD device 202. Active quenching circuitry may reduce the time it takes for SPAD device 202 to be reset. This may allow SPAD device 202 to detect incident light at a faster rate than when passive quenching circuitry is used, improving the dynamic range of the SPAD device. Active quenching circuitry may modulate the SPAD quench resistance. For example, before a photon is detected, quench resistance is set high and then once a photon is detected and the avalanche is quenched, quench resistance is minimized to reduce recovery time.

SPAD device 202 may also include readout circuitry 212. There are numerous ways to form readout circuitry 212 to obtain information from SPAD device 202. Readout circuitry 212 may include a pulse counting circuit that counts arriving photons. Alternatively or in addition, readout circuitry 212 may include time-of-flight circuitry that is used to measure photon time-of-flight (ToF). The photon time-of-flight information may be used to perform depth sensing. In one example, photons may be counted by an analog counter to form the light intensity signal as a corresponding pixel voltage. The ToF signal may be obtained by also converting the time of photon flight to a voltage. The example of an analog pulse counting circuit being included in readout circuitry 212 is merely illustrative. If desired, readout circuitry 212 may include digital pulse counting circuits. Readout circuitry 212 may also include amplification circuitry if desired.

The example in FIG. 1 of readout circuitry 212 being coupled to a node between diode 204 and quenching circuitry 206 is merely illustrative. Readout circuitry 212 may be coupled to terminal 208 or any desired portion of the SPAD device. In some cases, quenching circuitry 206 may be considered integral with readout circuitry 212.

Because SPAD devices can detect a single incident photon, the SPAD devices are effective at imaging scenes with low light levels. Each SPAD may detect the number of photons that are received within a given period of time (e.g., using readout circuitry that includes a counting circuit). However, as discussed above, each time a photon is received and an avalanche current initiated, the SPAD device must be quenched and reset before being ready to detect another photon. As incident light levels increase, the reset time becomes limiting to the dynamic range of the SPAD device (e.g., once incident light levels exceed a given level, the SPAD device is triggered immediately upon being reset).

Figure 2:
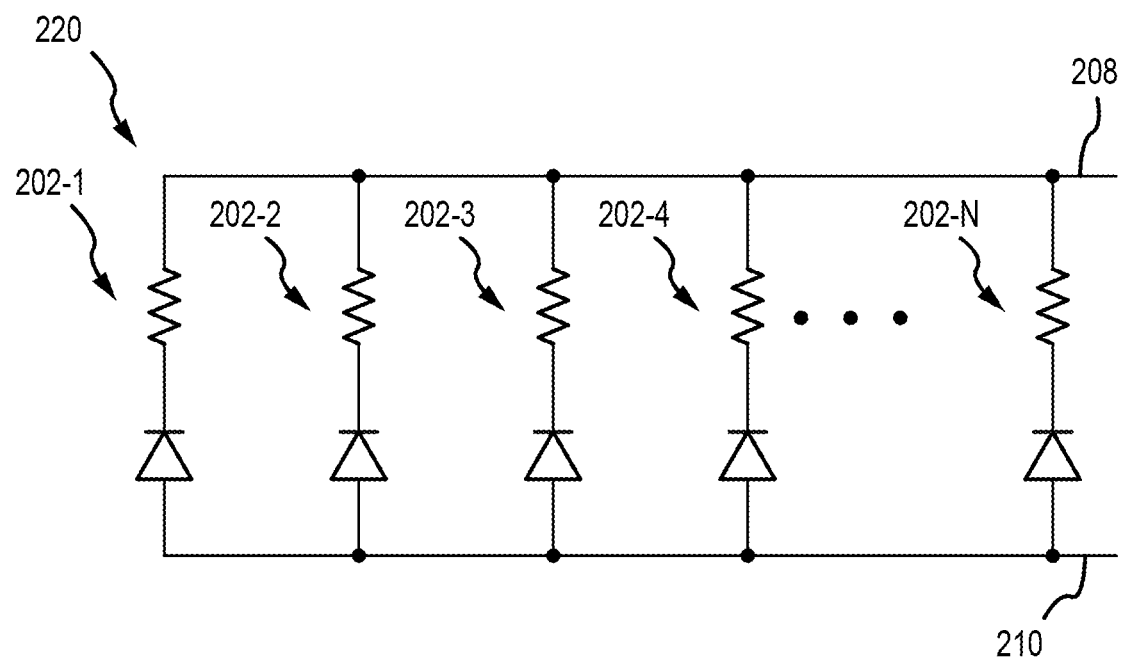
FIG. 2 is a diagram of an illustrative silicon photomultiplier in accordance with an embodiment.

Multiple SPAD devices may be grouped together to help increase dynamic range. FIG. 2 is a circuit diagram of an illustrative group 220 of SPAD devices 202. The group or array of SPAD devices may sometimes be referred to as a silicon photomultiplier (SiPM). As shown in FIG. 2, silicon photomultiplier 220 may include multiple SPAD devices that are coupled in parallel between first supply voltage terminal 208 and second supply voltage terminal 210. FIG. 2 shows N SPAD devices 202 coupled in parallel (e.g., SPAD device 202-1, SPAD device 202-2, SPAD device 202-3, SPAD device 202-4, . . . , SPAD device 202-N). More than two SPAD devices, more than ten SPAD devices, more than one hundred SPAD devices, more than one thousand SPAD devices, etc. may be included in a given silicon photomultiplier 220.

Each SPAD device 202 may sometimes be referred to herein as a SPAD pixel 202. Although not shown explicitly in FIG. 2, readout circuitry for the silicon photomultiplier 220 may measure the combined output current from all of SPAD pixels in the silicon photomultiplier. Configured in this way, the dynamic range of an imaging system including the SPAD pixels may be increased. Each SPAD pixel is not guaranteed to have an avalanche current triggered when an incident photon is received. The SPAD pixels may have an associated probability of an avalanche current being triggered when an incident photon is received. There is a first probability of an electron being created when a photon reaches the diode and then a second probability of the electron triggering an avalanche current. The total probability of a photon triggering an avalanche current may be referred to as the SPAD's photon-detection efficiency (PDE). Grouping multiple SPAD pixels together in the silicon photomultiplier therefore allows for a more accurate measurement of the incoming incident light. For example, if a single SPAD pixel has a PDE of 50% and receives one photon during a time period, there is a 50% chance the photon will not be detected. With the silicon photomultiplier 220 of FIG. 2, chances are that two of the four SPAD pixels will detect the photon, thus improving the provided image data for the time period.

The example of FIG. 2 in which the plurality of SPAD pixels 202 share a common output in silicon photomultiplier 220 is merely illustrative. In the case of an imaging system including a silicon photomultiplier having a common output for all of the SPAD pixels, the imaging system may not have any resolution in imaging a scene (e.g., the silicon photomultiplier can just detect photon flux at a single point). It may be desirable to use SPAD pixels to obtain image data across an array to allow a higher resolution reproduction of the imaged scene. In cases such as these, SPAD pixels in a single imaging system may have per-pixel readout capabilities. Alternatively, an array of silicon photomultipliers (each including more than one SPAD pixel) may be included in the imaging system. The outputs from each pixel or from each silicon photomultiplier may be used to generate image data for an imaged scene. The array may be capable of independent detection (whether using a single SPAD pixel or a plurality of SPAD pixels in a silicon photomultiplier) in a line array (e.g., an array having a single row and multiple columns or a single column and multiple rows) or an array having more than ten, more than one hundred, or more than one thousand rows and/or columns.

While there are a number of possible use cases for SPAD pixels as discussed above, the underlying technology used to detect incident light is the same. All of the aforementioned examples of devices that use SPAD pixels may collectively be referred to as SPAD-based semiconductor devices. A silicon photomultiplier with a plurality of SPAD pixels having a common output may be referred to as a SPAD-based semiconductor device. An array of SPAD pixels with per-pixel readout capabilities may be referred to as a SPAD-based semiconductor device. An array of silicon photomultipliers with per-silicon-photomultiplier readout capabilities may be referred to as a SPAD-based semiconductor device.

Figure 3:
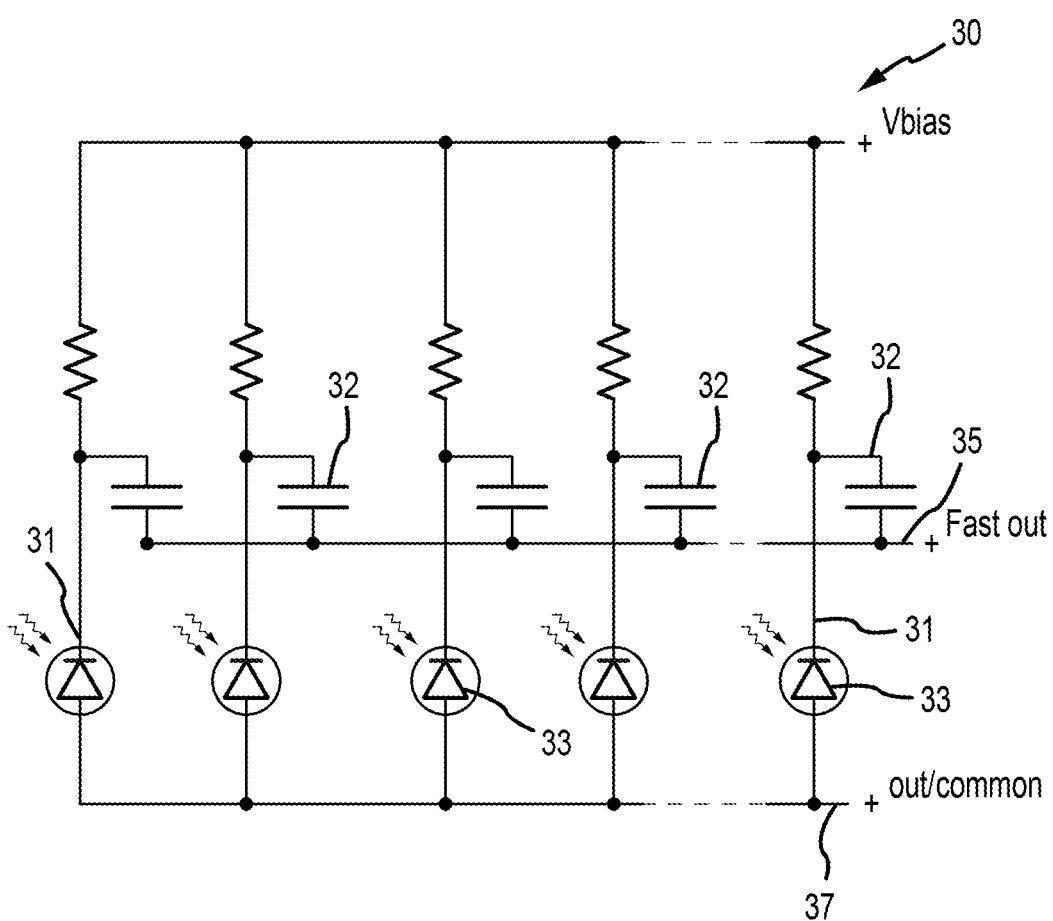
FIG. 3 is a schematic diagram of an illustrative silicon photomultiplier with a fast output terminal in accordance with an embodiment.

FIG. 3 illustrates a silicon photomultiplier 30. As shown in FIG. 3, SiPM 30 has a third terminal 35 which is capacitively coupled to each cathode terminal 31 in order to provide a fast readout of the avalanche signals from the SPADs 33. When then SPADs 33 emits a current pulse, part of the resulting change in voltage at the cathode 31 will be coupled via the mutual capacitance into the third ("fast") output terminal 35. Using the third terminal 35 for readout avoids the compromised transient performance resulting from the relatively large RC time constant associated with the biasing circuit that biases the top terminal of the quenching resistor.

Figure 4:
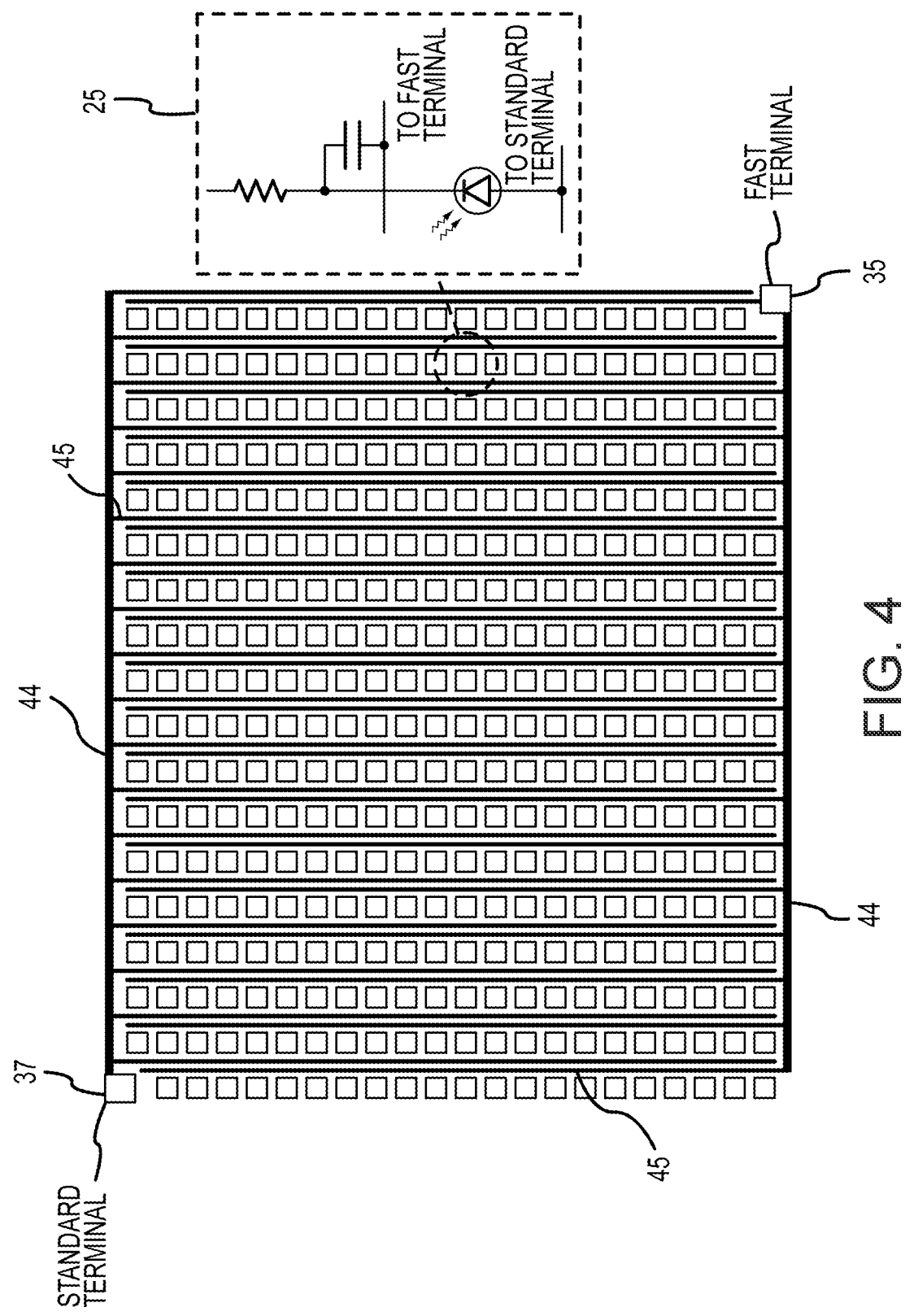
FIG. 4 is a diagram of an illustrative silicon photomultiplier comprising an array of microcells.

It will be appreciated by those skilled in the art that silicon photomultipliers include major bus lines 44 and minor bus lines 45 as illustrated in FIG. 4. The minor bus liens 45 may connect directly to each individual microcell 25. The minor bus lines 45 are then coupled to the major bus lines 44 which connect to the bond pads associated with terminals 37 and 35. Typically, the minor bus lines 45 extend vertically between the columns of microcells 25, whereas the major bus lines 44 extend horizontally adjacent the outer row of the microcells 25.

Figure 5:
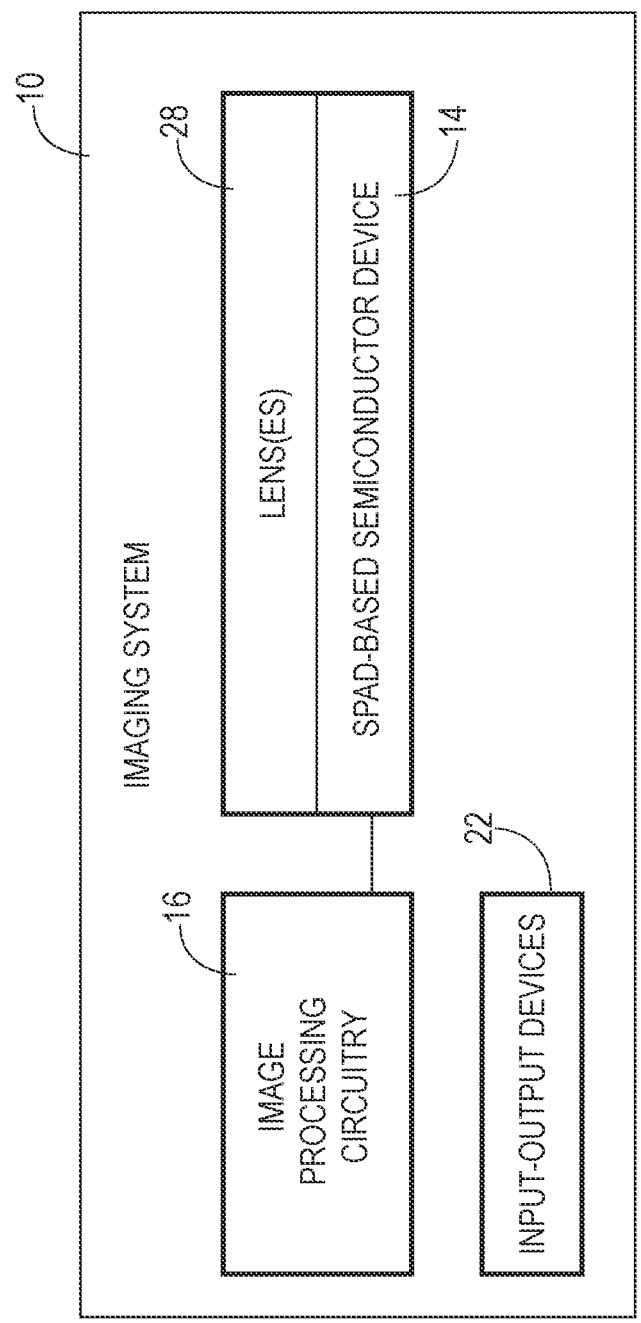
FIG. 5 is a schematic diagram of an illustrative imaging system that includes a SPAD-based semiconductor device in accordance with an embodiment.

An imaging system 10 with a SPAD-based semiconductor device is shown in FIG. 5. Imaging system 10 may be an electronic device such as a digital camera, a computer, a cellular telephone, a medical device, or other electronic device. Imaging system 10 may be an imaging system on a vehicle (sometimes referred to as vehicular imaging system). Imaging system may be used for LIDAR applications.

Imaging system 14 may include one or more SPAD-based semiconductor devices 14 (sometimes referred to as semiconductor devices 14, devices 14, SPAD-based image sensors 14, or image sensors 14). One or more lenses 28 may optionally cover each semiconductor device 14. During operation, lenses 28 (sometimes referred to as optics 28) may focus light onto SPAD-based semiconductor device 14. SPAD-based semiconductor device 14 may include SPAD pixels that convert the light into digital data. The SPAD-based semiconductor device may have any number of SPAD pixels (e.g., hundreds, thousands, millions, or more). In some SPAD-based semiconductor devices, each SPAD pixel may be covered by a respective color filter element and/or microlens.

The SPAD-based semiconductor device 14 may optionally include additional circuitry such as logic gates, digital counters, time-to-digital converters, bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Image data from SPAD-based semiconductor device 14 may be provided to image processing circuitry 16. Image processing circuitry 16 may be used to perform image processing functions such as automatic focusing functions, depth sensing, data formatting, adjusting white balance and exposure, implementing video image stabilization, face detection, etc. For example, during automatic focusing operations, image processing circuitry 16 may process data gathered by the SPAD pixels to determine the magnitude and direction of lens movement (e.g., movement of lens 28) needed to bring an object of interest into focus. Image processing circuitry 16 may process data gathered by the SPAD pixels to determine a depth map of the scene.

Imaging system 10 may provide a user with numerous high-level functions. In a computer or advanced cellular telephone, for example, a user may be provided with the ability to run user applications. To implement these functions, the imaging system may include input-output devices 22 such as keypads, buttons, input-output ports, joysticks, and displays. Additional storage and processing circuitry such as volatile and nonvolatile memory (e.g., random-access memory, flash memory, hard drives, solid state drives, etc.), microprocessors, microcontrollers, digital signal processors, application specific integrated circuits, and/or other processing circuits may also be included in the imaging system.

Input-output devices 22 may include output devices that work in combination with the SPAD-based semiconductor device. For example, a light-emitting component (such as a laser) may be included in the imaging system to emit light (e.g., infrared light or light of any other desired type). Semiconductor device 14 may measure the reflection of the light off of an object to measure distance to the object in a LIDAR (light detection and ranging) scheme.

As previously mentioned, in some cases a semiconductor device including single-photon avalanche diodes may be arranged in a line array (e.g., an array having a single row and multiple columns or a single column and multiple rows). Having line arrays with a high aspect ratio may be advantageous for scanning LIDAR applications.

Figure 6:
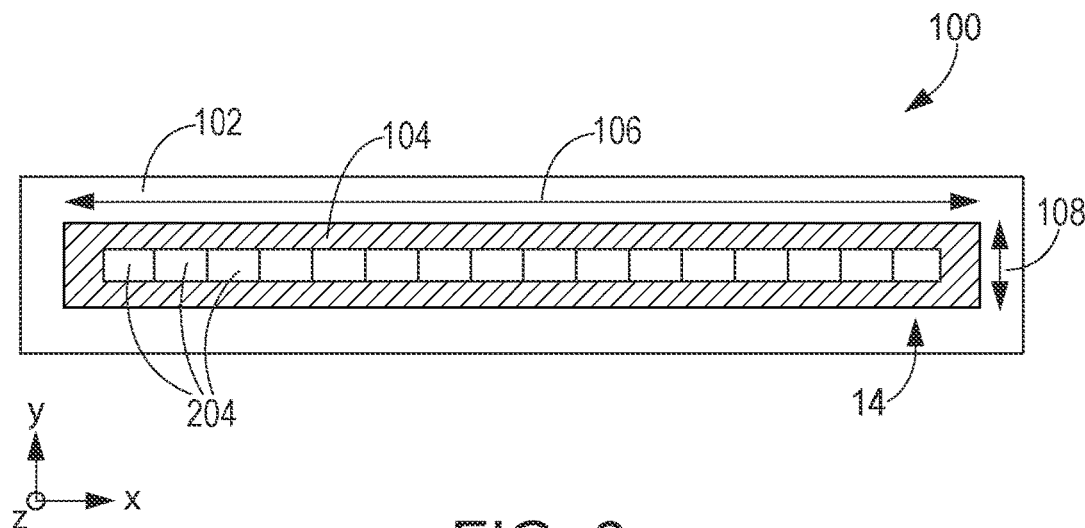
FIG. 6 is a top view of an illustrative semiconductor package that includes a line array of single-photon avalanche diodes in a single semiconductor die in accordance with an embodiment.

FIG. 6 is a top view of an illustrative semiconductor device package 100 that includes a high aspect ratio silicon photomultiplier. As shown, package 100 includes a SPAD-based semiconductor device 14 that is mounted to a package substrate 102. Package substrate 102 (sometimes referred to as package carrier 102) may be formed from ceramic, an organic laminate, or any other desired material. The SPAD-based semiconductor device 14 may include a semiconductor die 104 formed from a semiconductor material such as silicon. The silicon die 104 includes a plurality of single-photon avalanche diodes 204 arranged in a line (e.g., an array having a single row and multiple columns). The SPADs 204 are formed from doped portions of the silicon die.

The semiconductor die 104 may be attached to package substrate 102 using any desired techniques. For example, wire bonding, through-silicon vias (TSVs), or any other desired techniques may be used for attaching the die to the package substrate.

Increasing the aspect ratio of the line array formed using SPAD-based semiconductor device 14 may improve scanning LIDAR performance (e.g., by increasing the resolution of the device). In FIG. 6, a 1×16 array of SPADs is included in SPAD-based semiconductor device 14. The silicon die 104 that is used to form the 1×16 array of SPADs may have corresponding dimensions that are needed in order to provide sufficient room for the SPADs. In FIG. 6, silicon die 104 has a length 106 and a width 108. The aspect ratio of the silicon die may be defined by the length divided by the width.

In FIG. 6, width 108 may be less than 3 millimeters, less than 2 millimeters, less than 1 millimeter, greater than 0.5 millimeters, between 0.1 and 5 millimeters, etc. Length 106 may be greater than 5 millimeters, greater than 8 millimeters, greater than 10 millimeters, less than 12 millimeters, less than 10 millimeters, between 6 and 12 millimeters, etc. The aspect ratio of semiconductor die 104 may be greater than 3, greater than 4, greater than 5, greater than 6, less than 6, etc. In one illustrative example, the width 108 is between 2 and 3 millimeters while the length 106 is between 9 and 11 millimeters. The aspect ratio is therefore approximately between 3 and 5.5.

There may be a desire to have line arrays having even larger aspect ratio. For example, instead of a 1×16 array of SPADs, it may be desirable for the semiconductor package to include a 1×32 array of SPADs, 1×64 array of SPADs, 1×128 array of SPADs, etc. As the aspect ratio of the SPAD array increases, the aspect ratio of the silicon die used to provide the SPAD array also increases. Consider the example of a 1×64 array of SPADs. The semiconductor die used to provide this array may have the same width 108 as in FIG. 6 (e.g., between 2 and 3 millimeters). However, the length of the semiconductor die may be about four times greater than the length 106 in FIG. 6. The length of the semiconductor die for a 1×64 SPAD array may be between 30 and 40 millimeters. The aspect ratio of the silicon die for a 1×64 SPAD array is therefore between 10 and 20.

Providing silicon dice with such a high aspect ratio may have corresponding manufacturing challenges. Silicon dice having high aspect ratios may be delicate and susceptible to breaking during manufacturing. For example, the manufacturing equipment used to pick and place silicon dice may break silicon dice having such high aspect ratios. Specialized manufacturing equipment may potentially be used to handle high aspect ratio silicon dice. However, this may result in high costs and complexity for the manufacturing process.

To achieve a high aspect ratio SPAD array while maintaining silicon dice that are easy to manufacture and manipulate, the SPAD-based semiconductor device may be formed from multiple lower-aspect-ratio silicon dice instead of one high-aspect-ratio silicon die. The semiconductor package may be designed to minimize the impact of any gaps between silicon dice.

Figure 7:
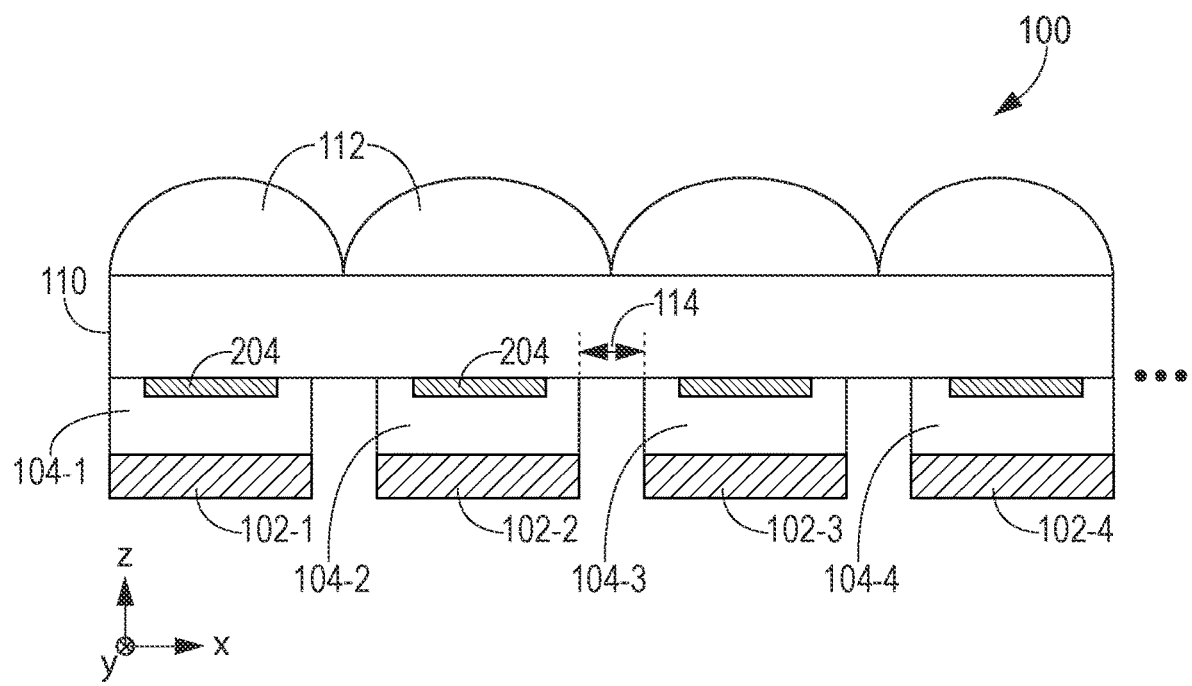
FIGS. 7 and 8 are side views of illustrative semiconductor packages that include a line array of single-photon avalanche diodes split between multiple semiconductor dice in accordance with an embodiment.

FIG. 7 is a side view of an illustrative semiconductor package that includes multiple silicon dice each having at least one respective single-photon avalanche diode. In the example of FIG. 7, silicon dice 104-1, 104-2, 104-3, and 104-4 are mounted on respective package substrates 102-1, 102-2, 102-3, and 102-4. The silicon dice may each include a subset of the overall SPAD array. In the example of FIG. 7, each silicon die includes a respective single SPAD 204.

In general, the semiconductor package may include a silicon photomultiplier that is formed by a line array of 10 or more SPADs, 12 or more SPADs, 16 or more SPADs, 32 or more SPADs, 64 or more SPADs, 128 or more SPADs, etc. Package 100 may include any desired number of silicon dice (e.g., two, three, four, four or more, six or more, eight or more, twelve or more, sixteen or more, thirty-two or more, sixty-four or more, one hundred and twenty-eight or more, etc.). Each silicon die may include a single SPAD or a line array of 1×n SPADs, where n is equal to any positive integer. Each die may include only 1 SPAD in one possible embodiment. Each die may include 2 SPADs, 3 SPADs, 4 SPADs, 4 or more SPADs, 8 or more SPADs, 10 or more SPADs, less than 20 SPADs etc. In general, each die may include sufficiently few SPADs to allow the die to have a sufficiently small aspect ratio to remain robust during manufacturing. Above some limit of SPADs, the dice may be susceptible to breaking during manufacturing as discussed above. Therefore, the dice may include a number of SPADs that does not exceed the aforementioned limit. In FIG. 7, each silicon die includes the same number of SPADs. However, different dice in a single package may include different number of SPADs if desired.

Gaps 114 may be present between the silicon dice in package 100. The gaps 114 may be required for manufacturing tolerances while forming package 100. To mitigate discontinuity in the SPAD array caused by gaps 114, lenses 112 may be included to focus light onto the silicon dice. As shown, a package lid 110 may be formed over semiconductor dice 104. The package lid 110 may be a transparent layer of glass, epoxy, or another desired material. The package lid 110 may provide a sealed environment for the underlying dice to prevent moisture and other contaminants from damaging the dice.

Lenses 112 may be formed on the upper surface of package lid 110. The lenses 112 may extend over the gaps 114 to focus incident light away from the gaps 114 and towards the SPADs in the silicon dice. Lenses 112 may be formed from the same material as the package lid and may have an index of refraction that is greater than 1.3, greater than 1.4, greater than 1.5, between 1.3 and 1.7, or any other desired value. The lenses 112 may also be formed from a different material than the package lid if desired. In general, lenses 112 may be formed from a transparent material such as glass, silicon, plastic (epoxy), or another desired material.

Lenses 112 may be cylindrical lenses (e.g., that are curved along the X-axis but not along the Y-axis). The cylindrical lenses therefore focus light onto the underlying SPADs, mitigating adverse effects caused by the requisite gaps between the chips. Each semiconductor die is covered (overlapped) by a respective lens. For example, die 104-1 is covered by a first lens, die 104-2 is covered by a second lens, etc. Adjacent lenses may touch at an interface that overlaps a gap 114 between adjacent dice.

In the example of FIG. 7, each silicon die 104 has a respective discrete package substrate. This example is merely illustrative. Alternatively, each silicon die 104 may be attached to a common package substrate, as shown in FIG. 8.

Figure 8:
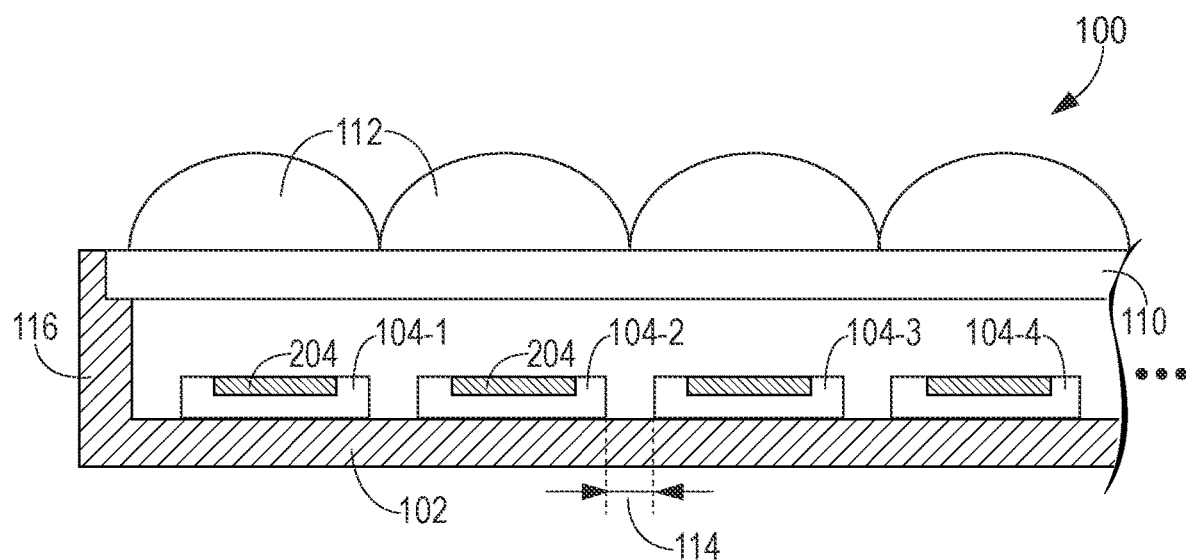

In FIG. 8, silicon dice 104-1, 104-2, 104-3, and 104-4 are attached to common package substrate 102. The package carrier may also include sidewalls 116 that are attached to the package lid 110. Again, lenses 112 are included on the package lid to focus incident light away from gaps 114 and towards the SPADs 204.

Silicon dice 104 may be electrically connected to the package carrier (e.g., conductive contacts in the package) using through-silicon vias, wire bonds, or any other desired techniques. As one example, the silicon dice may be coupled to the package material using through-silicon vias in FIG. 7 and using wire bonds in FIG. 8. Wire bonds may allow for the width of gaps 114 to be smaller than when through-silicon vias are used. Gaps 114 may be less than 0.3 millimeters, less than 0.2 millimeters, less than 0.1 millimeters, less than 0.05 millimeters, etc.

In general, the lenses 112 (sometimes referred to as microlenses, light focusing structures, etc.) may be manufactured in any desired manner. In one example, the package lid may be etched to form lenses 112. In this case the package lid and lenses 112 are all formed integrally. In another possible example, the package lid may have discrete portions each etched with a respective lens. The discrete portions are then separately attached to the package. In yet another possible example, the package lid and integrated lenses 112 may be injection molded. In yet another possible example, lenses may be formed separately from the package lid and attached to an upper surface of the package lid (e.g., using adhesive).

Figure 9:
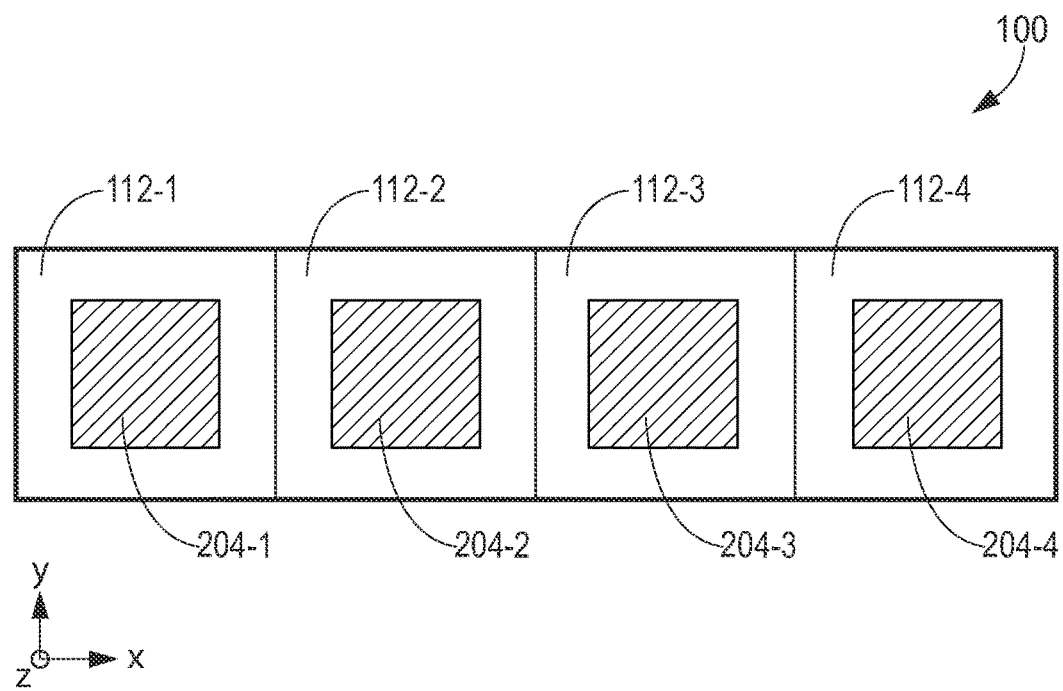
FIG. 9 is a top view of an illustrative semiconductor package that includes a line array of single-photon avalanche diodes split between multiple semiconductor dice and a respective lens over each semiconductor die in accordance with an embodiment.

FIG. 9 is a top view of an illustrative package showing how lenses 112 may overlap respective dice with single-photon avalanche diodes 204. As shown, lens 112-1 overlaps SPAD 204-1 (on a first respective silicon die), lens 112-2 overlaps SPAD 204-2 (on a second respective silicon die), lens 112-3 overlaps SPAD 204-3 (on a third respective silicon die), lens 112-4 overlaps SPAD 204-4 (on a fourth respective silicon die), etc. The lenses may have curvature along the X-axis such that incident light is focused to the underlying single-photon avalanche diode.

The example of including one lens for each semiconductor die is merely illustrative. In another possible arrangement, multiple lenses may be provided for a single semiconductor die. An example of this type is shown in FIG. 10.

Figure 10:
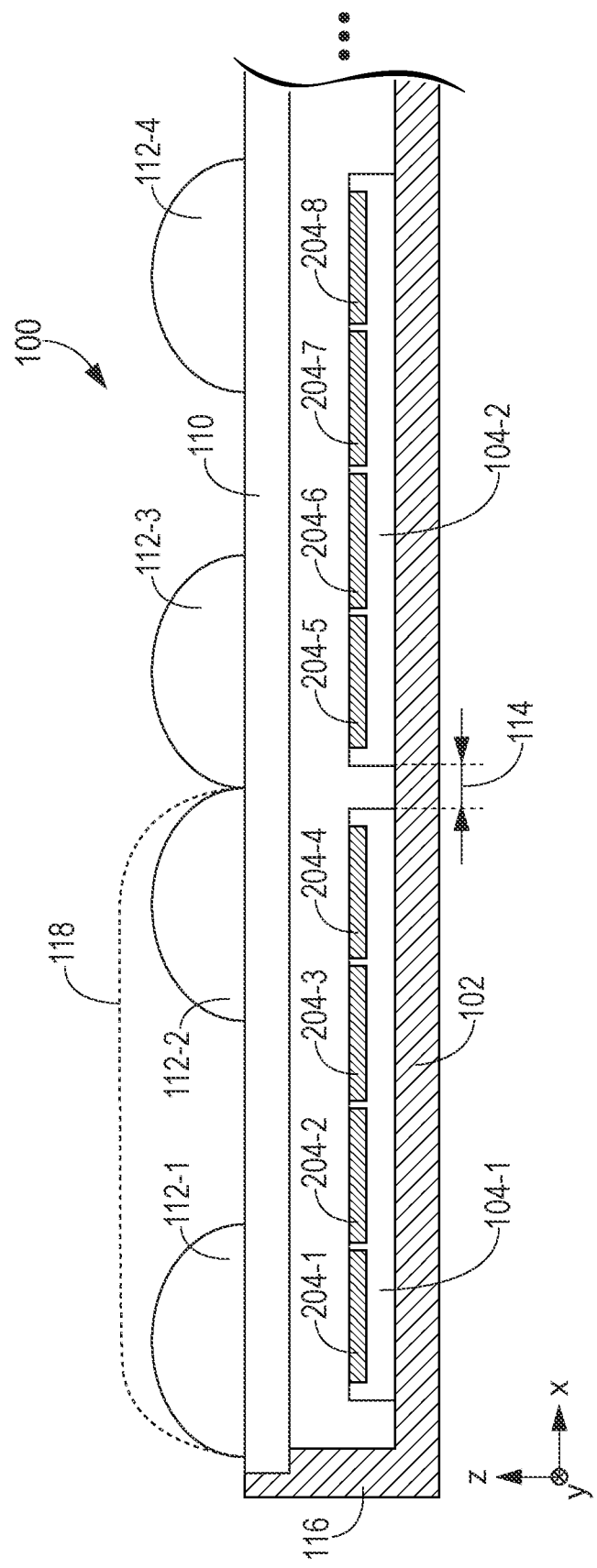
FIG. 10 is a side view of an illustrative semiconductor package that includes multiple semiconductor dice that each include multiple single-photon avalanche diodes and lenses over the edge single-photon avalanche diodes in accordance with an embodiment.

FIG. 10 is a side view of an illustrative semiconductor package with multiple silicon dice each having multiple single-photon avalanche diodes. In the example of FIG. 10, each silicon die includes a line array of 1×4 single-photon avalanche diodes. SPADs 204-1, 204-2, 204-3, and 204-4 are included in silicon die 104-1. SPADs 204-5, 204-6, 204-7, and 204-8 are included in silicon die 104-2. This example is merely illustrative and other sub-array sizes may be used if desired.

Similar to as discussed above, gap 114 is required between silicon dice 104-1 and 104-2 to allow for manufacturing tolerances while forming package 100. To avoid gap 114 adversely effecting the performance of the silicon photomultiplier formed using the SPADs in package 100, lenses 112 are included. Lenses 112 may be formed from the same material as the package lid and may have an index of refraction that is greater than 1.3, greater than 1.4, greater than 1.5, between 1.3 and 1.7, or any other desired value. The lenses 112 may also be formed from a different material than the package lid if desired. In general, lenses 112 may be formed from a transparent material such as glass, silicon, plastic (epoxy), or another desired material.

Instead of having one lens 112 over each SPAD (as in FIGS. 7-9), there are lenses formed over only the edge SPADs in semiconductor package 100. SPADs 204-1, 204-2, 204-3, and 204-4 are arranged in a line with SPADs 204-1 and 204-4 on the edges of die 104-1. A first lens 112-1 is formed over edge SPAD 204-1 and a second lens 112-2 is formed over edge SPAD 204-4. Lenses 112-1 and 112-2 may ensure that incident light is focused on the edge SPADs instead of passing to gaps 114 between the dice.

SPADs 204-5, 204-6, 204-7, and 204-8 are arranged in a line with SPADs 204-5 and 204-8 on the edges of die 104-2. A first lens 112-3 is formed over edge SPAD 204-5 and a second lens 112-4 is formed over edge SPAD 204-8. Lenses 112-3 and 112-4 may ensure that incident light is focused on the edge SPADs instead of passing to gaps 114 between the dice.

Lenses 112 may be cylindrical lenses (e.g., that are curved along the X-axis but not along the Y-axis). The cylindrical lenses therefore focus light onto the underlying SPADs, mitigating adverse effects caused by the requisite gaps between the chips.

In FIGS. 7-10, proper alignment between the silicon dice in package 100 and the overlying lenses that redirect light to the dice is important to ensure satisfactory sensing performance. To account for manufacturing tolerance in the positioning of the lenses relative to the silicon dice, the SPADs on the ends of each sub-array may be made longer than the central SPADs of each sub-array. For example, SPADs 204-1 and 204-4 may be longer (in the X-direction) than SPADs 204-2 and 204-3. Similarly, SPADs 204-5 and 204-8 may be longer (in the X-direction) than SPADs 204-6 and 204-7. Having the edge SPADs be longer in this way allows for misalignment tolerance during package manufacturing.

The example in FIG. 10 of two discrete lenses (at the edges of the die) being used to cover each die is merely illustrative. In another possible arrangement, a single lens having a profile 118 as shown in FIG. 10 may be used. The single lens may have edge curvature that focuses light away from gaps 114. The single lens may have a planar upper surface as depicted in FIG. 10 (e.g., a central portion with less curvature than the edge portions).

In general, regardless of how the SPAD array is split between the semiconductor dice (e.g., one SPAD per die or multiple SPADs per die), there may be one lens per SPAD, one lens per die, one lens per edge SPAD, or any other lens arrangement for redirecting incident light away from gaps 114 towards the SPAD array.

An anti-reflective coating may be formed over the package lid 110 and/or lenses 112 in FIGS. 7-10.

The foregoing is merely illustrative and various modifications can be made by those skilled in the art. The foregoing embodiments may be implemented individually or in any combination.

What is claimed is:

1. A semiconductor package comprising:
   a plurality of semiconductor dice, wherein each one of the plurality of semiconductor dice has a first edge, a second edge, a first single-photon avalanche diode adjacent to the first edge, and a second single-photon avalanche diode adjacent to the second edge; and
   a plurality of lenses, wherein the first and second single-photon avalanche diodes of each semiconductor die are overlapped by respective first and second lenses of the plurality of lenses, wherein each one of the plurality of semiconductor dice has a third single-photon avalanche diode between the first and second single-photon avalanche diodes and wherein a center of the third single-photon avalanche diode is not overlapped by any lens of the plurality of lenses.

2. The semiconductor package defined in claim 1, wherein each one of the plurality of semiconductor dice includes at least four respective single-photon avalanche diodes.

3. The semiconductor package defined in claim 1, wherein the plurality of semiconductor dice forms a line array of single-photon avalanche diodes.

4. The semiconductor package defined in claim 3, wherein the line array extends in a first direction and wherein there is a respective gap in the first direction between each adjacent pair of semiconductor dice.

5. The semiconductor package defined in claim 4, wherein each gap is overlapped by at least one of the plurality of lenses in a second direction that is orthogonal to the first direction.

6. The semiconductor package defined in claim 4, wherein each gap is overlapped by a respective two of the plurality of lenses in a second direction that is orthogonal to the first direction.

7. The semiconductor package defined in claim 3, wherein the line array of single-photon avalanche diodes includes time-of-flight circuitry.

8. The semiconductor package defined in claim 1, wherein each one of the plurality of semiconductor dice has a fourth single-photon avalanche diodes between the first and second single-photon avalanche diodes, wherein the first lens overlaps all of the first single-photon avalanche diode and some but not all of the third single-photon avalanche diode, and wherein the second lens overlaps all of the second single-photon avalanche diode and some but not all of the fourth single-photon avalanche diode.

9. The semiconductor package defined in claim 1, further comprising:
   a package substrate, wherein the plurality of semiconductor dice is mounted to the package substrate.

10. The semiconductor package defined in claim 1, further comprising:
    a package lid that is formed from a single piece of transparent material that overlaps the plurality of semiconductor dice.

11. The semiconductor package defined in claim 10, wherein the transparent material comprises a material selected from the group consisting of: glass and epoxy.

12. A semiconductor package comprising:
- a plurality of semiconductor dice that forms a line array of single-photon avalanche diodes, wherein each one of the plurality of semiconductor dice has a first edge, a second edge, a first edge single-photon avalanche diode adjacent to the first edge, a second edge single-photon avalanche diode adjacent to the second edge, and a plurality of central single-photon avalanche diodes interposed between the first and second edge single-photon avalanche diodes; and
- a plurality of lenses, wherein the first and second edge single-photon avalanche diodes of each semiconductor die are overlapped by respective first and second lenses of the plurality of lenses, wherein the line array extends in a first direction, and wherein, for each semiconductor die of the plurality of semiconductor dice, the first and second edge single-photon avalanche diodes have a greater size in the first direction than all of the central single-photon avalanche diodes.

13. The semiconductor package defined in claim 12, further comprising:
- a package substrate, wherein the plurality of semiconductor dice is mounted to the package substrate; and
- a package lid that is formed from a single piece of transparent material that overlaps the plurality of semiconductor dice.

14. The semiconductor package defined in claim 13, wherein there is a respective gap in the first direction between each adjacent pair of semiconductor dice.

15. The semiconductor package defined in claim 14, wherein each gap is overlapped by at least one of the plurality of lenses in a second direction that is orthogonal to the first direction.

16. The semiconductor package defined in claim 14, wherein each gap is overlapped by a respective two of the plurality of lenses in a second direction that is orthogonal to the first direction.

17. The semiconductor package defined in claim 12, wherein the first lens overlaps all of the first edge single-photon avalanche diode and some but not all of a first central single-photon avalanche diode of the plurality of central single-photon avalanche diodes, and wherein the second lens overlaps all of the second edge single-photon avalanche diode and some but not all of a second central single-photon avalanche diode of the plurality of central single-photon avalanche diodes.

18. The semiconductor package defined in claim 12, wherein the line array of single-photon avalanche diodes includes time-of-flight circuitry.

* * * * *